(12) United States Patent
Youn et al.

(10) Patent No.: US 7,364,987 B2
(45) Date of Patent: Apr. 29, 2008

(54) METHOD FOR MANUFACTURING SEMICONDUCTOR DEVICE

(75) Inventors: Ki-Seog Youn, Suwon-si (KR);
Jong-Hyon Ahn, Suwon-si (KR);
Hee-Sung Kang, Sungnam-si (KR);
Tae-Woong Kang, Suwon-si (KR)

(73) Assignee: Samsung Electronics Co., Ltd., Suwon-si, Gyeonngi-do (KR)

( * ) Notice: Subject to any disclaimer, the term of this patent is extended or adjusted under 35 U.S.C. 154(b) by 316 days.

(21) Appl. No.: 11/034,981

(22) Filed: Jan. 14, 2005

(65) Prior Publication Data

US 2005/0158984 A1 Jul. 21, 2005

(30) Foreign Application Priority Data

Jan. 19, 2004 (KR) .................. 10-2004-0003766

(51) Int. Cl.
*H01L 21/322* (2006.01)

(52) U.S. Cl. .................. 438/471; 438/758; 438/928; 257/E21.318

(58) Field of Classification Search ............... 438/471, 438/758, 928; 257/E21.318
See application file for complete search history.

(56) References Cited

U.S. PATENT DOCUMENTS

| | | | | |
|---|---|---|---|---|
| 5,296,385 | A | * | 3/1994 | Moslehi et al. .............. 438/514 |
| 5,656,510 | A | * | 8/1997 | Chrapacz et al. ........... 438/394 |
| 5,757,063 | A | * | 5/1998 | Tomita et al. .............. 257/610 |
| 5,958,796 | A | * | 9/1999 | Prall et al. .................. 438/694 |
| 6,043,114 | A | * | 3/2000 | Kawagoe et al. ........... 438/197 |
| 6,118,163 | A | * | 9/2000 | Gardner et al. ............. 257/412 |
| 6,358,821 | B1 | * | 3/2002 | Gupta et al. ................ 438/476 |
| 6,664,577 | B2 | * | 12/2003 | Takayanagi ................. 257/288 |
| 2005/0153537 | A1 | * | 7/2005 | Cheng et al. ............... 438/627 |

FOREIGN PATENT DOCUMENTS

KR 2002-0052680 7/2002
KR 2003-0049362 A 6/2003

* cited by examiner

*Primary Examiner*—Michael Lebentritt
*Assistant Examiner*—Stanetta Isaac
(74) *Attorney, Agent, or Firm*—Volentine & Whitt, P.L.L.C.

(57) ABSTRACT

In a method of forming a semiconductor device, a copper diffusion-prevention layer is formed underneath a substrate. Impurity regions are formed on the surface of the substrate. A copper wiring is electrically connected to the impurity regions. The copper diffusion-prevention layer is formed before forming the lightly doped source/drain regions to prevent copper atoms from diffusing into the substrate.

24 Claims, 17 Drawing Sheets

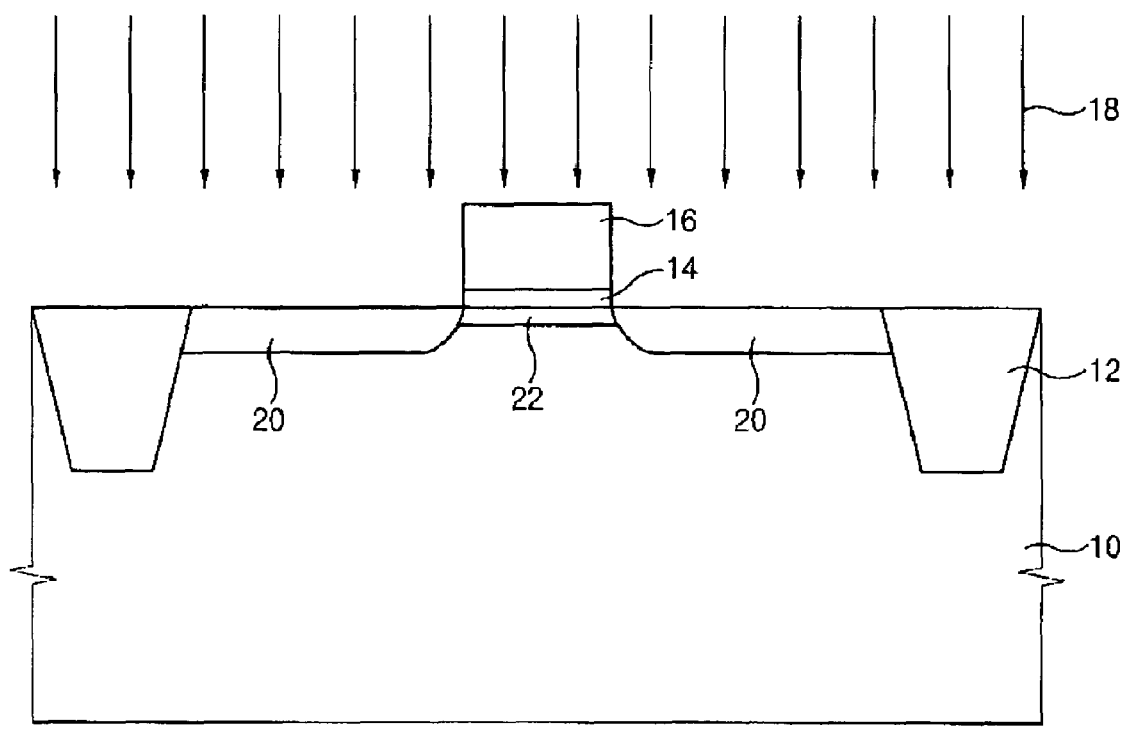

METHOD FOR MANUFACTURING SEMICONDUCTOR DEVICE

BACKGROUND OF THE INVENTION

1. Field of the Invention

The present invention generally relates to a method for manufacturing a semiconductor device. More particularly, the present invention generally relates to a method for manufacturing a semiconductor device having a copper diffusion-prevention layer.

A claim of priority is made to Korean Patent Application No. 2004-3766, filed on Jan. 19, 2004, the contents of which are herein incorporated by reference.

2. Description of the Related Arts

Aluminum wiring has been conventionally used in semiconductor devices because of its low contact resistance and ease of use. As the semiconductor device has gotten highly integrated, the width of wires have gotten narrower and the length longer. As a result, wire resistance and parasite capacitance have increased. To overcome these problems, other metals with good electromigration have been used. For example, copper with its low specific resistance of about 1.6 $\mu\Omega\cdot cm$ and good electromigration has been used. Currently copper wiring is widely used in semiconductor devices.

However, during or after the formation of the copper wires on a semiconductor substrate, copper atoms tend to diffuse into the semiconductor substrate, which deteriorate characteristics of the semiconductor device. To prevent copper diffusion, a diffusion-prevention layer is formed on the underside of the semiconductor substrate prior to the formation of the copper wiring.

FIGS. 1A to 1E are cross sectional views illustrating a conventional method for forming a copper wiring in a semiconductor device.

Referring to FIG. 1A, an isolation layer 12 is formed in a silicon substrate 10. Isolation layer 12 divides substrate 10 into an active region and a field region. A gate electrode 16 with a gate insulation layer 14 is formed in the active region.

Referring to FIG. 1B, low concentration of first impurities are implanted into substrate 10 using gate electrode 16 and gate insulation layer 14 as an ion implanting mask to form lightly doped source/drain regions 20 on substrate 10. As a result, a channel region 22 is formed under gate electrode 16 and gate insulation layer 14 between lightly doped source/drain regions 20.

Referring to FIG. 1C, a gate spacer layer 24 is formed on substrate 10 and gate electrode 16. Also, a copper diffusion-prevention layer 27 is formed on the underside of substrate 10. Copper diffusion-prevention layer 27 prevents copper atoms from diffusing into substrate 10 in a subsequent copper wiring formation step. Gate spacer layer 24 is formed by a low pressure chemical vapor deposition (LPCVD) process at a high temperature. However, the high temperature causes the impurities in source/drain regions 20 to diffuse further into substrate 10 causing source/drain regions 22a to expand, thus narrowing channel region 22a.

Referring to FIG. 1D, gate spacer layer 24 is etched-back to form a gate spacer 24a on sidewalls of gate electrode 16. High concentration of second impurities are implanted into substrate 10 using gate electrode 16 and gate spacer 24a as an ion implanting mask to form heavily doped source/drain regions 26. Silicide layers 28a, 28b are formed on gate electrode 16 and heavily doped source/drain regions 26, respectively.

Referring to FIG. 1E, an insulating interlayer (not shown) is formed on silicide layers 28a, 28b, gate spacer 24a, and isolation layer 12. The insulating interlayer is partially etched to expose gate electrode 16 and silicide layers 28a, 28b to form an insulating interlayer pattern 30 having a plurality of contact holes. A copper layer (not shown) is formed on insulating interlayer pattern 30 to fill the plurality of contact holes. The copper layer is patterned to form a copper wiring 32.

However, as described with reference to FIG. 1C, the impurities in lightly doped source/drain regions 20 diffuse into substrate 10 due to the high temperature used during the formation of gate spacer layer 24, which reduces the length of channel region 22a. This phenomenon causes a punch-through, reducing the threshold voltage. The phenomenon is referred to as a short channel effect.

SUMMARY OF THE INVENTION

The present invention provides a method for forming a semiconductor device having improved electrical characteristics.

In a method for forming a semiconductor device in accordance with one aspect of the present invention a method of manufacturing a semiconductor device by forming a metal diffusion-prevention layer on a bottom surface of a substrate, forming a gate electrode in an active region that is defined on a top surface of the substrate after the formation of the metal diffusion-prevention layer, forming impurity regions in a top surface of the substrate after forming the metal diffusion-prevention layer, and forming a metal wiring on the impurity regions.

According to another embodiment of the present invention, a method for manufacturing a semiconductor device by forming a metal diffusion-prevention layer on a bottom surface of a substrate, forming a gate electrode in an active region that is defined on a top surface of the substrate after the formation of the metal diffusion-prevention layer, implanting first impurities into the substrate using the gate electrode as an ion-implanting mask to form lightly doped source/drain regions, forming a gate spacer on sidewalls of the gate electrode, implanting second impurities into the substrate using the gate electrode and the gate spacer as an ion-implanting mask to form heavily doped source/drain regions, forming a metal wiring on the heavily doped source/drain regions and the gate electrode, and electrically connecting the metal wiring to the heavily doped source/drain regions and the gate electrode.

In another embodiment of the present invention, a method for manufacturing a semiconductor device by stacking a silicon substrate, a buried oxide layer, and a single silicon crystalline layer, forming a metal diffusion-prevention layer underneath a silicon substrate, forming a gate electrode in an active region that is defined on a top surface of the silicon substrate after the formation of the metal diffusion-prevention layer, implanting first impurities into the substrate using the gate electrode as an ion-implanting mask to form lightly doped source/drain regions, forming a gate spacer on sidewalls of the gate electrode, implanting second impurities into the substrate using the gate electrode and the gate spacer as an ion-implanting mask to form heavily doped source/drain regions, forming a metal wiring on the heavily doped source/drain regions and the gate electrode, and electrically connecting the metal wiring to the heavily doped source/drain regions and the gate electrode.

BRIEF DESCRIPTION OF THE DRAWINGS

The above aspects of the present invention will become more apparent by describing preferred embodiments in detail with reference to the attached drawings in which:

FIGS. 1A to 1E are cross sectional views illustrating a conventional method for manufacturing a semiconductor device;

DESCRIPTION OF THE EMBODIMENTS

The present invention will be described more fully hereinafter with reference to the accompanying drawings, in which preferred embodiments of the invention are shown.

Embodiment 1

FIGS. 2A to 2G are cross sectional views illustrating a method for manufacturing a semiconductor device in accordance with a first embodiment of the present invention.

Figure 1A:
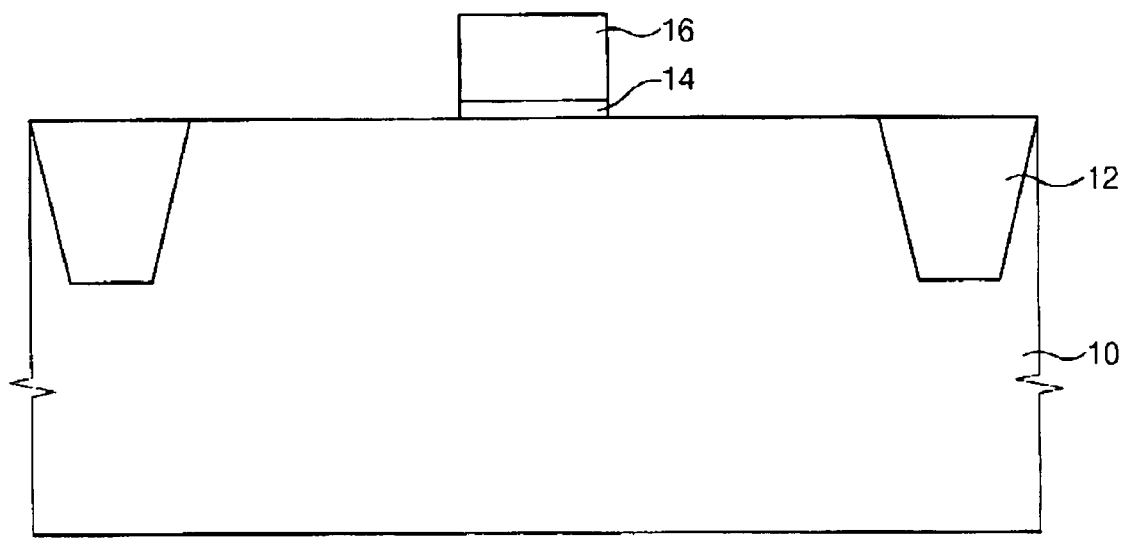
Figure 1C:
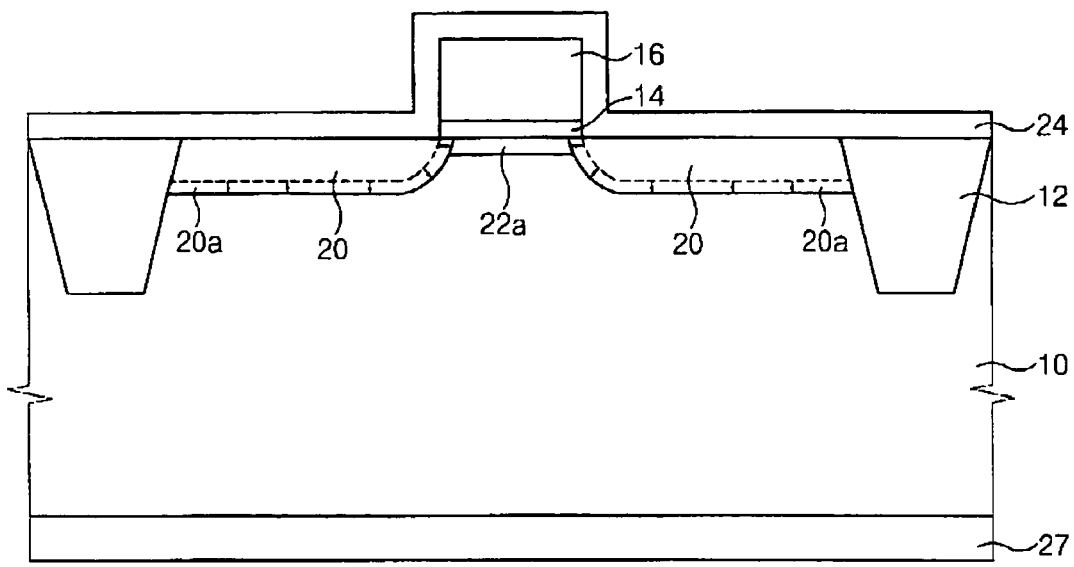
Figure 1D:
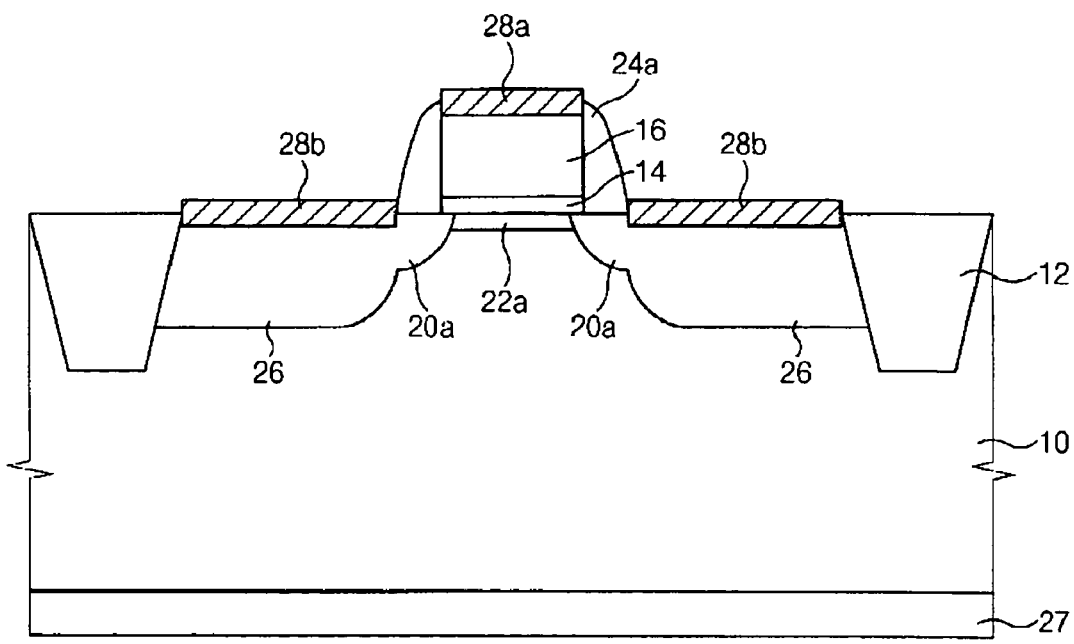
Figure 1E:
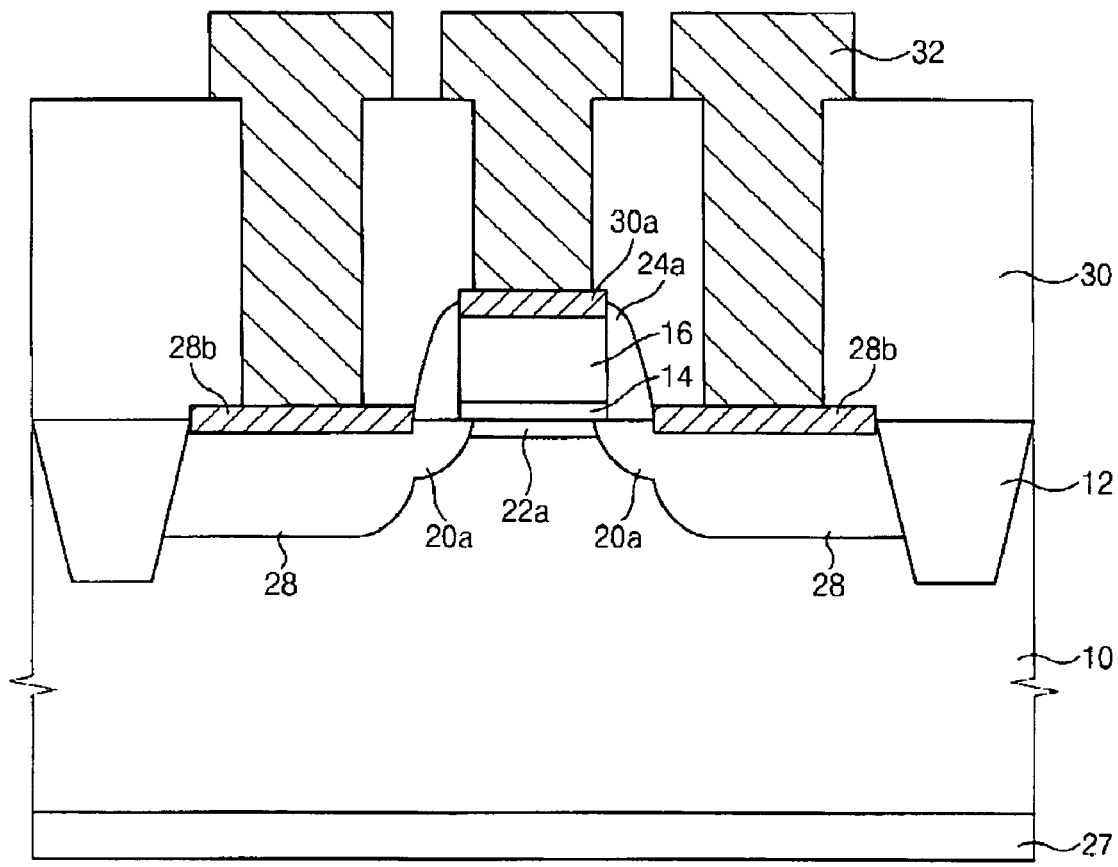
Figure 2A:
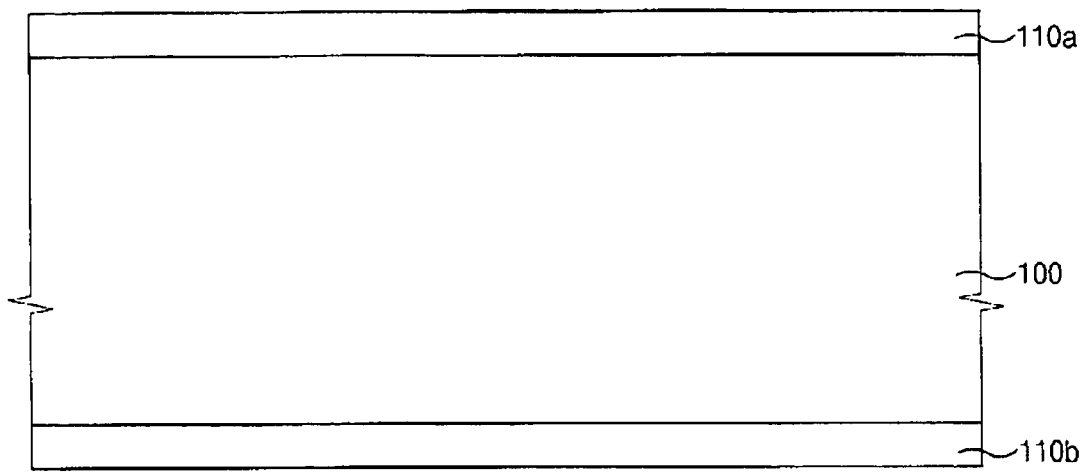
FIGS. 2A to 2G are cross sectional views illustrating a method for manufacturing a semiconductor device in accordance with a first embodiment of the present invention.

Referring to FIG. 2A, a hard mask layer 110a and a metal diffusion-prevention layer 110b are formed on top and on a bottom surface a silicon semiconductor substrate 100, respectively. Hard mask layer 110a and metal diffusion-prevention layer 110b are of silicon nitride. Hard mask layer 110a and metal diffusion-prevention layer 110b are preferably formed by an LPCVD process at a temperature of about 700° C. to 750° C. Additionally, prior to the formation of hard mask layer 110a and metal diffusion-prevention layer 110b, a pad oxide layer (not shown) may be formed on the top face of substrate 100.

Figure 2B:
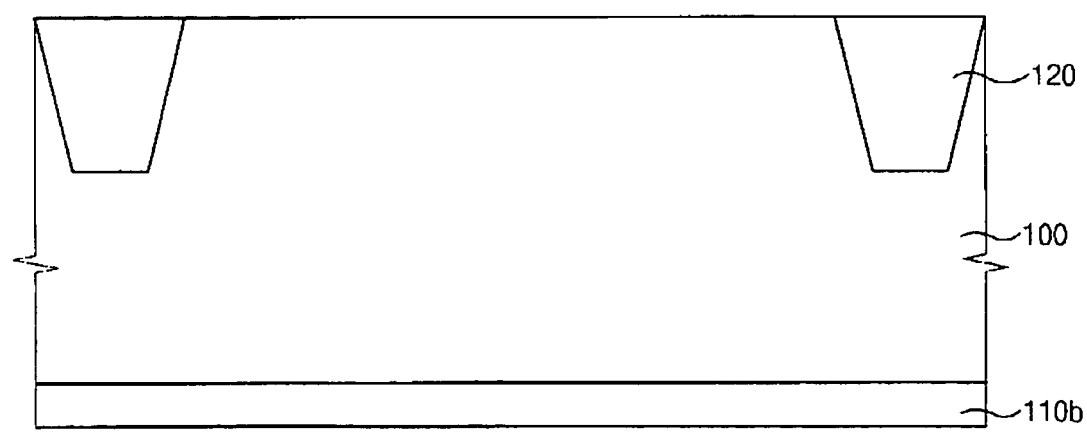

Referring to FIG. 2B, hard mask layer 110a is patterned to form a hard mask layer pattern (not shown). A shallow trench is formed on substrate 100 using the hard mask layer pattern as a mask. A silicon oxide layer (not shown) such as an undoped silicate glass layer, a high-density plasma oxide layer, or the like is formed on substrate 100 and in the trench. The silicon oxide layer is removed by a chemical mechanical polishing (CMP) process or an etch-back process until the top face of substrate 100 is exposed. The hard mask layer pattern is removed by a dry etching process to form isolation layer 120 defining an active region and a field region in substrate 100.

Figure 2C:
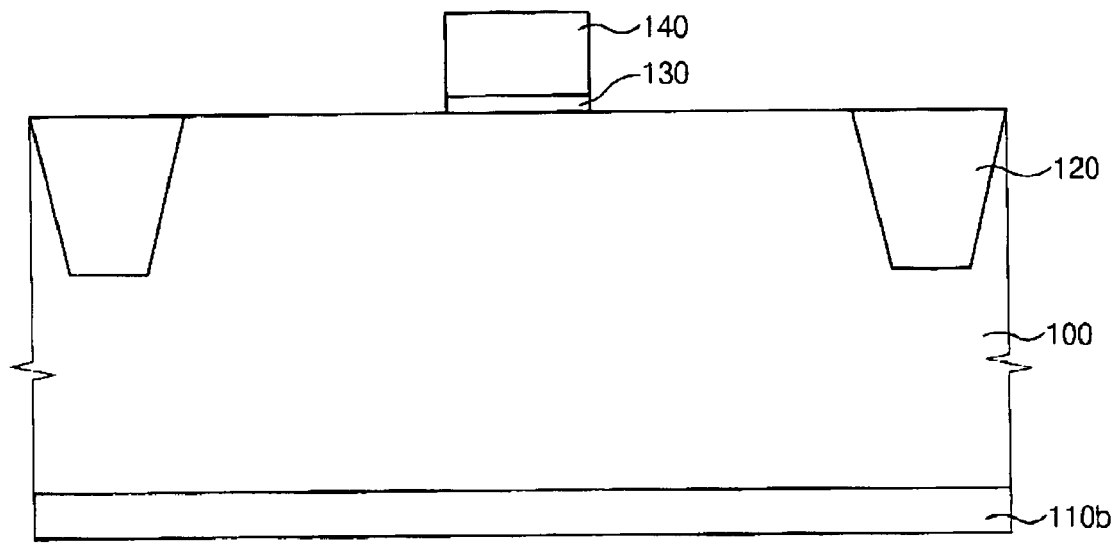

Referring to FIG. 2C, a gate insulation layer (not shown) is formed on substrate 100 and isolation layer 120. A polysilicon layer is then formed on the gate insulation layer. The polysilicon layer and the gate insulation layer are patterned to form a gate electrode 140 with a gate insulation layer pattern 130 in the active region.

Figure 2D:
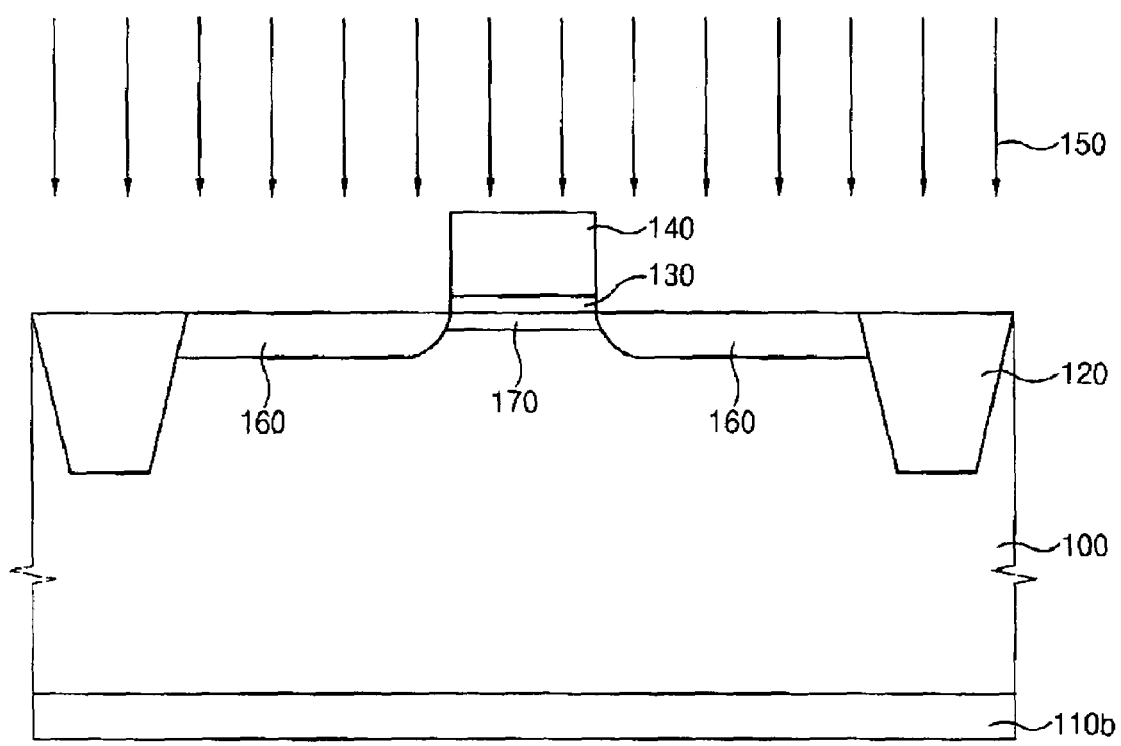

Referring to FIG. 2D, low concentration of first impurities 150 are implanted into substrate 100 using gate electrode 140 as an ion implanting mask to form lightly doped source/drain regions 160 on both sides of gate electrode 140. As a result, a channel region 170 is formed under gate electrode 140 between lightly doped source/drain regions 160.

Figure 2E:
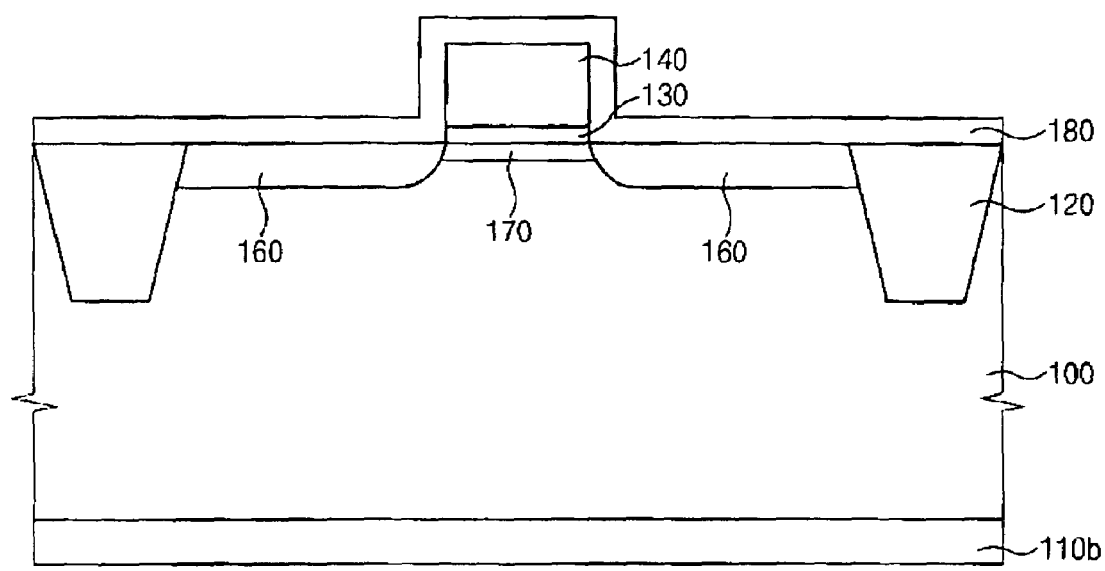

Referring to FIG. 2E, a gate spacer layer 180 of a second nitride is formed on substrate 100 and gate electrode 160. Gate spacer layer 180 is preferably formed by a PECVD process at a temperature of no more than about 500° C. First impurities 150 do not diffuse into substrate 100 during a low temperature PECVD process. Therefore, the length of channel region 170 is maintained.

Figure 2F:
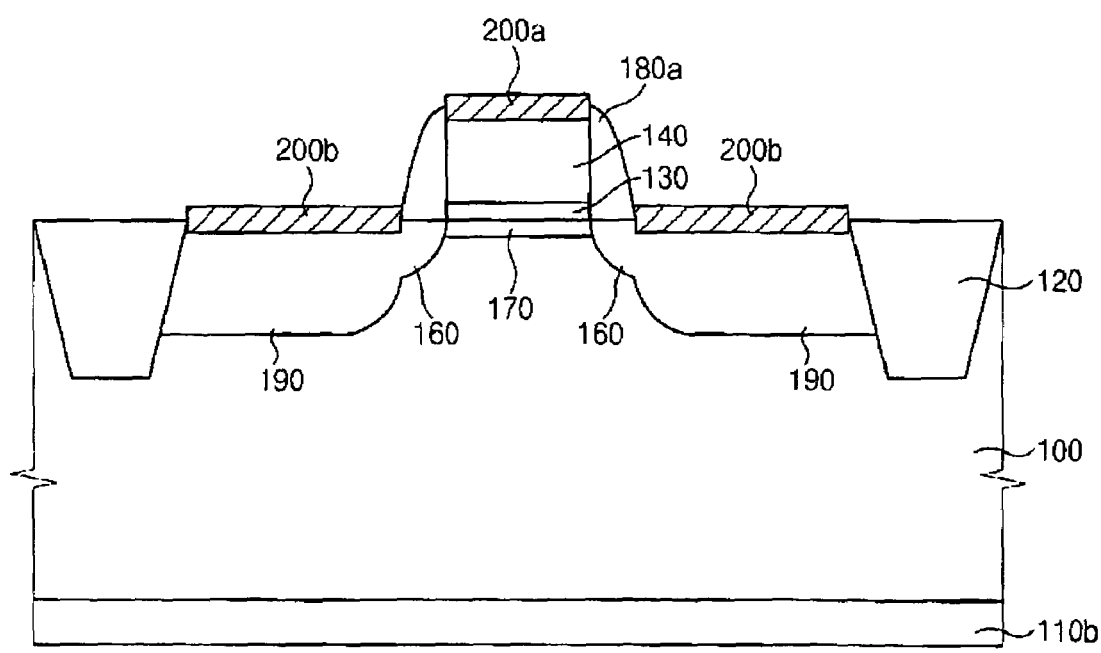

Referring to FIG. 2F, gate spacer layer 180 is etched-back to form a gate spacer 180a on sidewalls of gate electrode 160. High concentrations of second impurities are implanted into substrate 100 to form heavily doped source/drain regions 190 on both sides of gate electrode 160. Silicide layers 200a, 200b are formed on gate electrode 160 and highly doped source/drain regions 190, respectively.

Figure 2G:
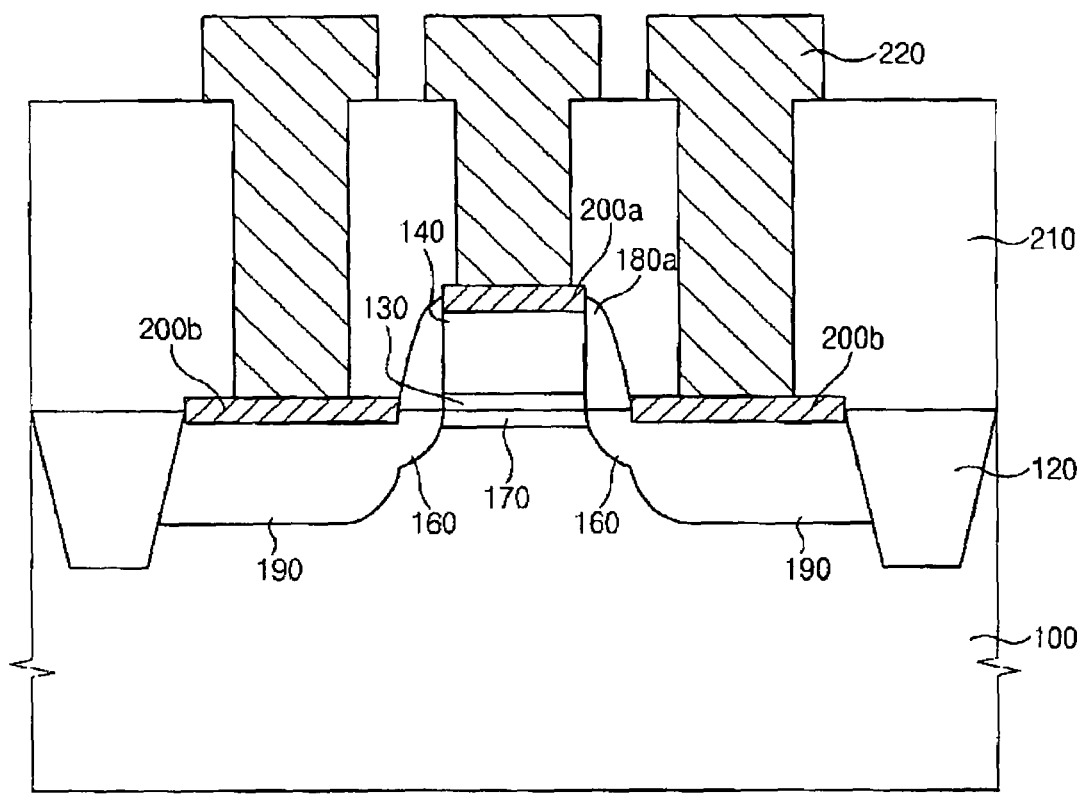

Referring to FIG. 2G, an insulating interlayer (not shown) is formed on substrate 100, silicide layers 200a, 200b, and gate spacer 180a. The insulating interlayer is partially etched to form an insulating interlayer pattern 210 having a plurality of contact holes that expose silicide layers 200a, 200b. A metal layer (not shown) is formed on insulating interlayer 210 and in the plurality of contact holes. The metal layer is patterned to form a metal wiring 220 electrically connected to silicide layers 200a, 200b. Finally, metal diffusion-prevention layer 110b is removed. The metal layer is preferably copper.

Embodiment 2

Figure 3A:
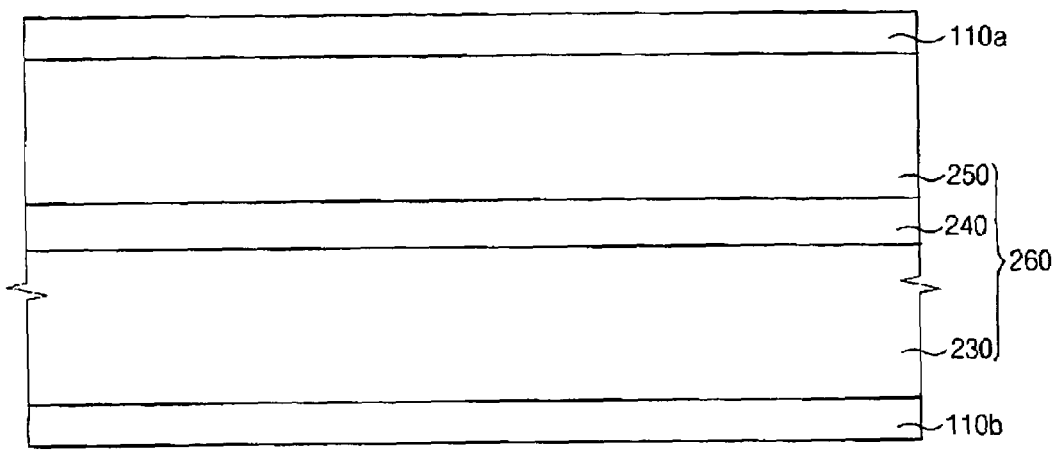
FIGS. 3A to 3C are cross sectional views illustrating a method for manufacturing a semiconductor device in accordance with a second embodiment of the present invention.
Figure 3B:
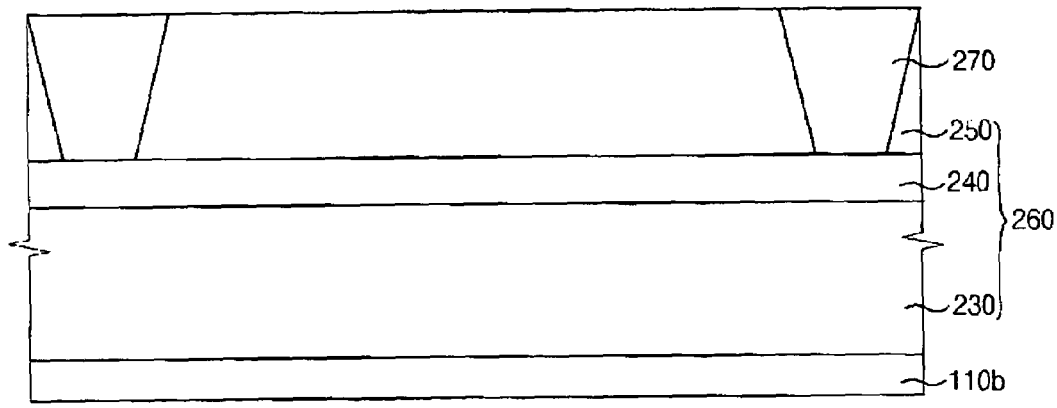
Figure 3C:
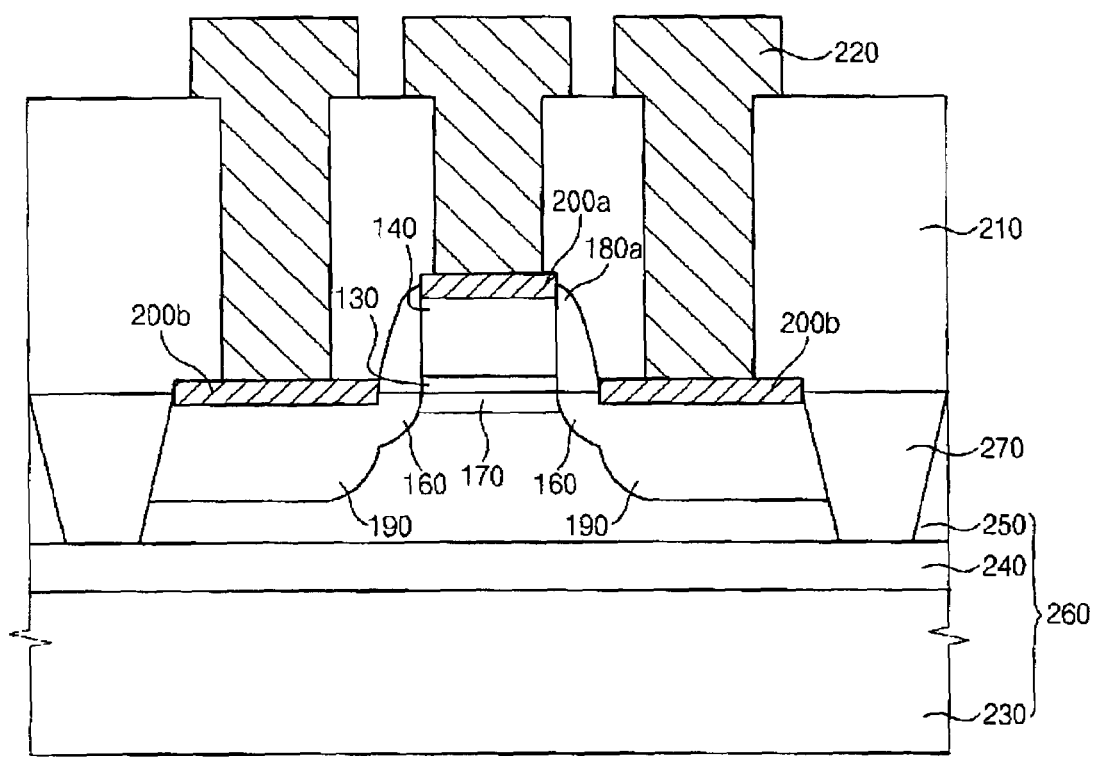

FIGS. 3A to 3C are cross sectional views illustrating a method for manufacturing a semiconductor device in accordance with a second embodiment of the present invention.

In FIGS. 3A to 3C, same reference numerals refer to substantially the same elements as in the first embodiment. Thus, further illustrations of the same elements are omitted.

A silicon-on-insulator (SOI) substrate is employed as a substrate in the present embodiment. The SOI substrate sequentially includes a silicon substrate, a buried oxide layer, and a single crystalline silicon layer. The silicon substrate has little influence on the single crystalline silicon layer because of the buried oxide layer, which acts as an insulation layer; therefore, the single crystalline silicon layer is readily treated.

Referring to FIG. 3A, a SOI substrate 260 sequentially includes a stacked silicon substrate 230, a buried oxide layer 240, and a single crystalline silicon layer 250. A hard mask layer 110a is formed on single crystalline silicon layer 250. A metal diffusion-prevention layer 110b is formed on the underside of silicon substrate 230. Hard mask layer 110a and metal diffusion-prevention layer 110b are of silicon nitride.

Referring to FIG. 3B, hard mask layer 110a is patterned to form a hard mask layer pattern (not shown). Single crystalline silicon layer 250 is etched using the hard mask layer pattern as an etching mask to form a trench exposing buried oxide layer 240. A silicon oxide layer (not shown) such as an undoped silicate glass layer, a high-density plasma oxide layer, or the like is formed on single crystalline silicon layer 250 and in the trench. The silicon oxide layer is removed by a chemical mechanical polishing (CMP) process or an etch-back process until the surface of single crystalline silicon layer 250 is exposed. The hard mask layer pattern is removed by a dry etching process to form an isolation layer 270 defining an active region and a field region in single crystalline silicon layer 250.

Referring to FIG. 3C, a gate electrode 140 having a gate insulation layer pattern 130 is formed on single crystalline silicon layer 250. Low concentration of impurities are implanted into single crystalline silicon layer 250 using gate electrode 140 as an ion implanting mask to form lightly doped source/drain regions 160 at both sides of gate electrode 140. As a result, a channel region 170 is formed under gate electrode 140 between lightly doped source/drain regions 160. A gate spacer layer 180 of a second nitride is formed on single crystalline silicon layer 250 and gate electrode 160. Gate spacer 180 is etched-back to form a gate spacer 180a on sidewalls of gate electrode 160.

High concentration of second impurities are implanted into single crystalline silicon layer 250 to form heavily doped source/drain regions 190 at both sides of gate electrode 160. Silicide layers 200a, 200b are formed on gate electrode 160 and highly doped source/drain regions 190, respectively. An insulating interlayer (not shown) is formed on single crystalline silicon layer 250, silicide layers 200a, 200b, and gate spacer 180a. The insulating interlayer is partially etched to form an insulating interlayer pattern 210 having a plurality of contact holes that expose silicide layers 200a, 200b. A metal layer (not shown) is formed on insulating interlayer 210 and in the plurality of contact holes. The copper layer is patterned to form a metal wiring 220 electrically connected to silicide layers 200a, 200b. Finally, metal diffusion-prevention layer 110b underneath silicon substrate 230 is removed. The metal layer is preferably copper.

Embodiment 3

FIGS. 4A to 4F are cross sectional views illustrating a method for manufacturing a semiconductor device in accordance with a third embodiment of the present invention.

In FIGS. 4A to 4F, same reference numerals refer to substantially same elements as in the first embodiment. Thus, any further illustrations of the same elements are omitted.

Figure 4A:
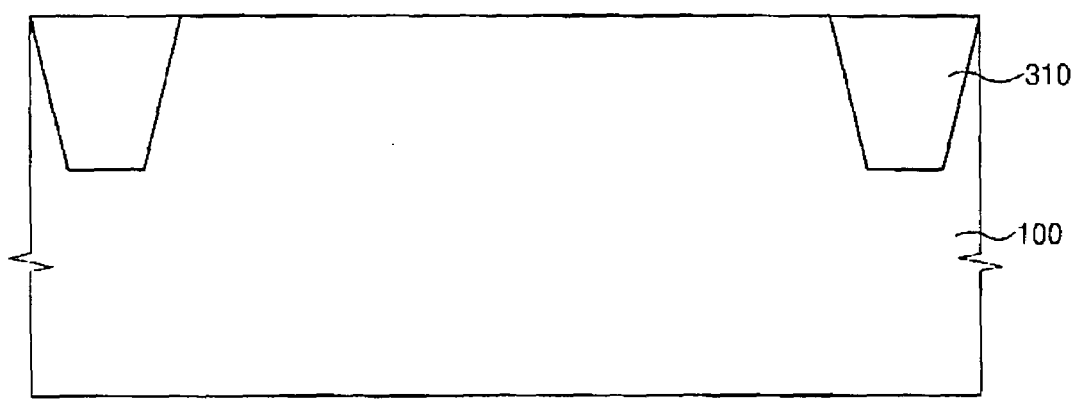
FIGS. 4A to 4F are cross sectional views illustrating a method for manufacturing a semiconductor device in accordance with a third embodiment of the present invention.

Referring to FIG. 4A, a hard mask layer (not shown) and a pad oxide layer (not shown) are sequentially formed on a substrate 100. The hard mask layer and the pad oxide layer are patterned to form a hard mask layer pattern (not shown). A shallow trench is formed on substrate 100 using the hard mask layer pattern as a mask. A silicon oxide layer (not shown) such as an undoped silicate glass layer, a high-density plasma oxide layer or the like is formed on substrate 100 and in the trench. The silicon oxide layer is removed by a chemical mechanical polishing (CMP) process or an etch-back process until the surface of substrate 100 is exposed. The hard mask layer pattern is removed by a dry etching process to form an isolation layer 310 defining an active region and a field region in substrate 100.

Figure 4B:
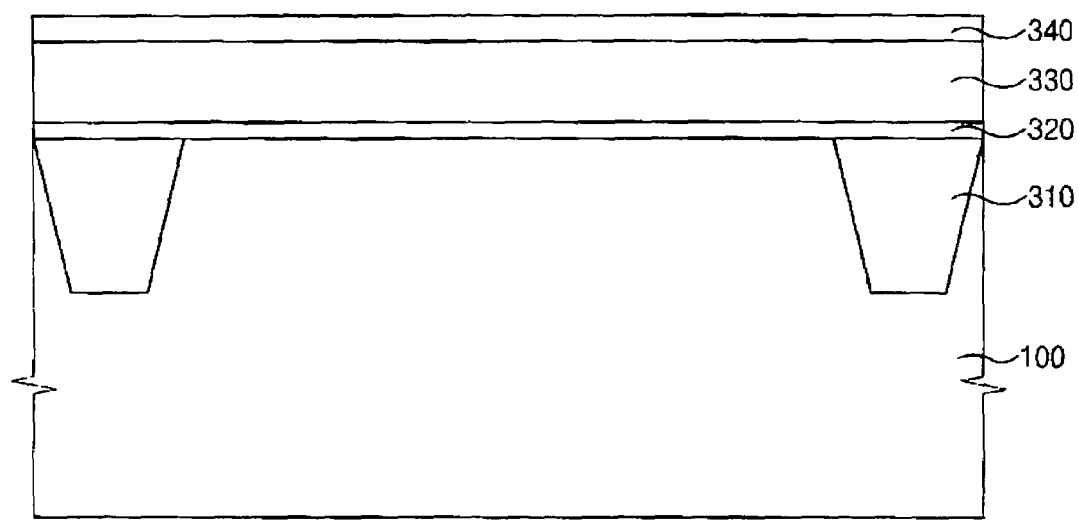

Referring to FIG. 4B, a gate insulation layer 320, a polysilicon layer 330, and a buffer oxide layer 340 are sequentially formed on substrate 100.

Figure 4C:
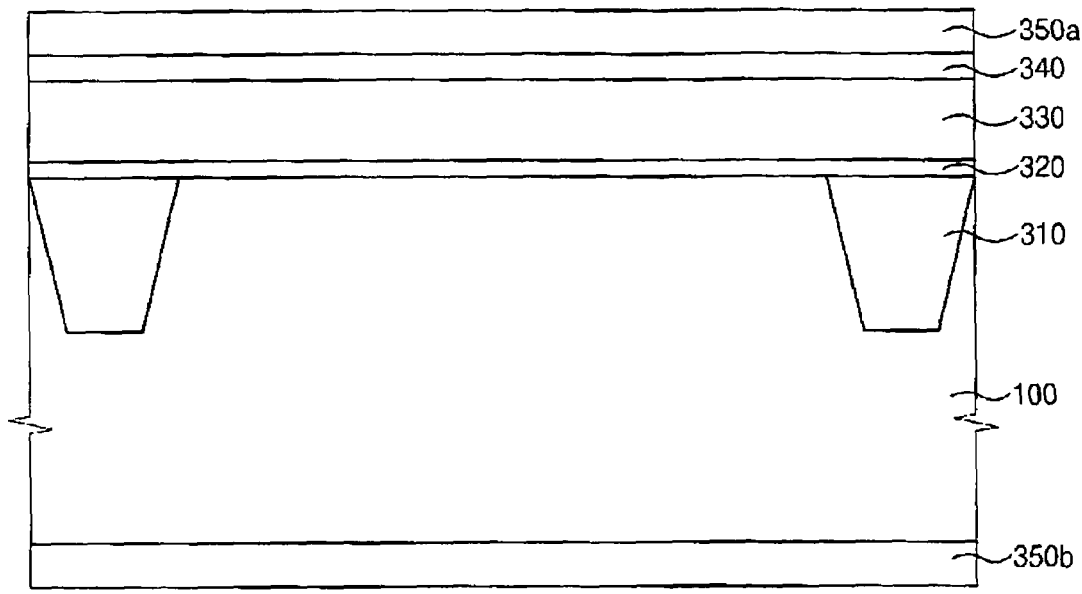

Referring to FIG. 4C, metal diffusion-prevention layers 350a, 350b of silicon nitride are formed on buffer oxide layer 340 and bottom side of substrate 100, respectively. Metal diffusion-prevention layers 350a, 350b are preferably formed by an LPCVD process at a temperature of about 700° C. to 750° C.

Figure 4D:
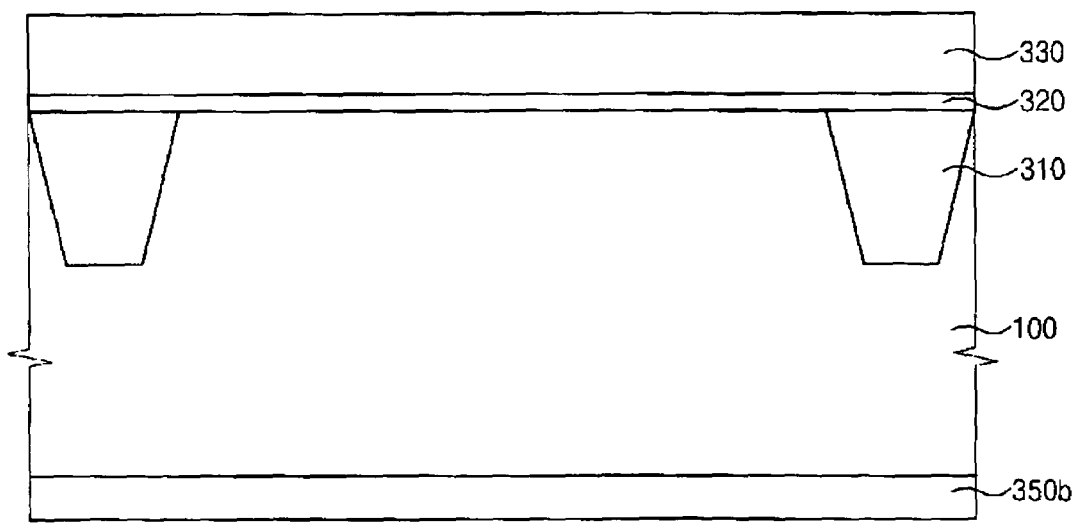

Referring to FIG. 4D, metal diffusion-prevention layer 350a is removed by a dry etching process. Buffer oxide layer 340 is then removed by a wet etching process to prevent polysilicon layer 330 from being damaged. If there is no buffer oxide layer 340 on polysilicon layer 330, polysilicon layer 330 is damaged during the dry etching process to remove copper diffusion-prevention layer 350a, which causes unevenness on the surface of silicide layers.

Figure 4E:
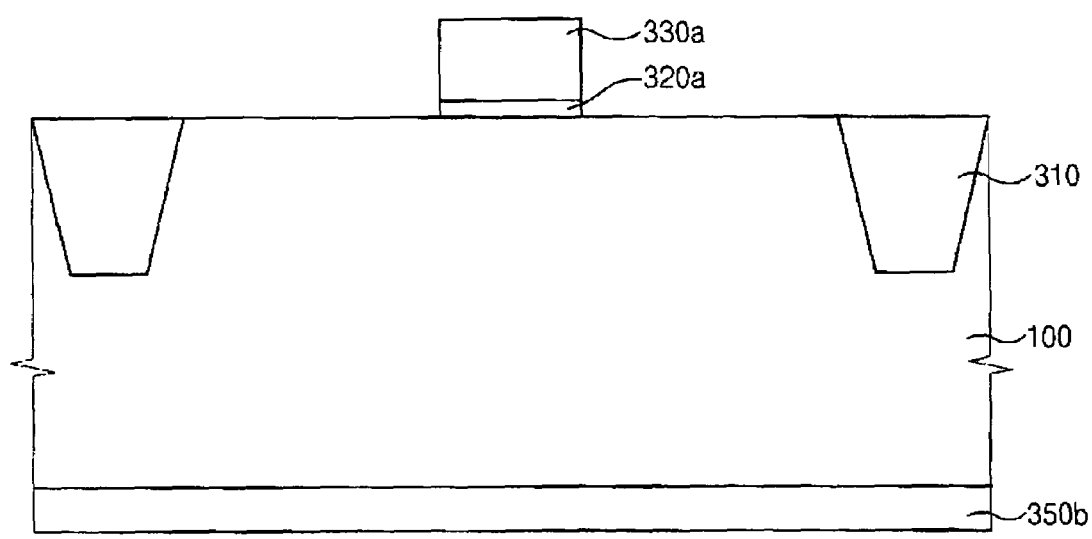

Referring to FIG. 4E, polysilicon layer 330 and gate insulation layer 320 are patterned to form a gate electrode 330a having a gate insulation layer pattern 320a on the active region.

Figure 4F:
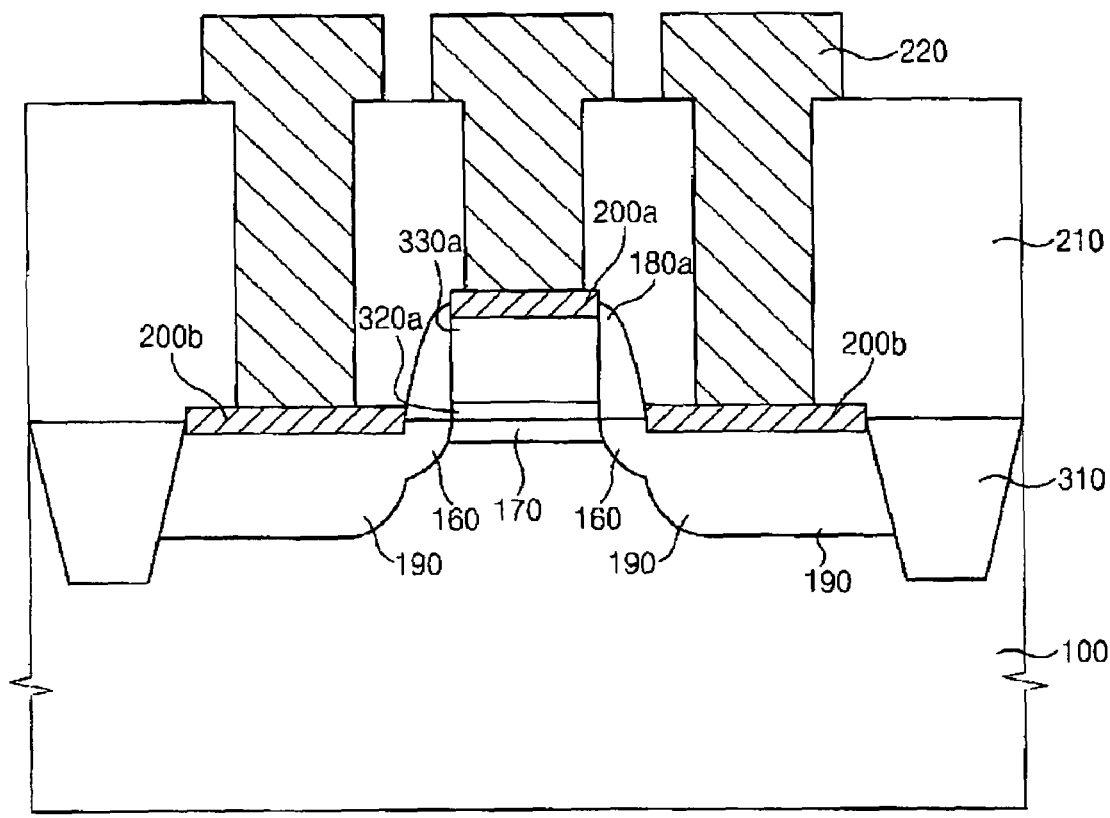

Referring to FIG. 4F, low concentration of first impurities are implanted into substrate 100 using gate electrode 330a as an ion-implanting mask to form lightly doped source/drain regions 160 at both sides of gate electrode 330a. As a result, a channel region 170 is formed under gate electrode 330a between lightly doped source/drain regions 160.

A gate spacer layer 180 of a second nitride is formed on substrate 100 and gate electrode 330a. Gate spacer layer 180 is etched-back to form a gate spacer 180a on sidewalls of gate electrode 330a.

High concentration of second impurities are implanted into substrate 100 to form heavily doped source/drain regions 190 on substrate 100 at both sides of gate electrode 330a. Silicide layers 200a, 200b are formed on gate electrode 330a and highly doped source/drain regions 190, respectively.

An insulating interlayer (not shown) is formed on substrate 100, silicide layers 200a, 200b, and gate spacer 180a. The insulating interlayer is partially etched to form an insulating interlayer pattern 210 having a plurality of contact holes that expose silicide layers 200a, 200b. A metal layer (not shown) is formed on insulating interlayer 210 and in the plurality of contact holes. The metal layer is patterned to form a metal wiring 220 electrically connected to silicide layers 200a, 200b. The metal diffusion-prevention layer 350b underneath substrate 100 is then removed. The metal layer is preferably copper.

Embodiment 4

Figure 5A:
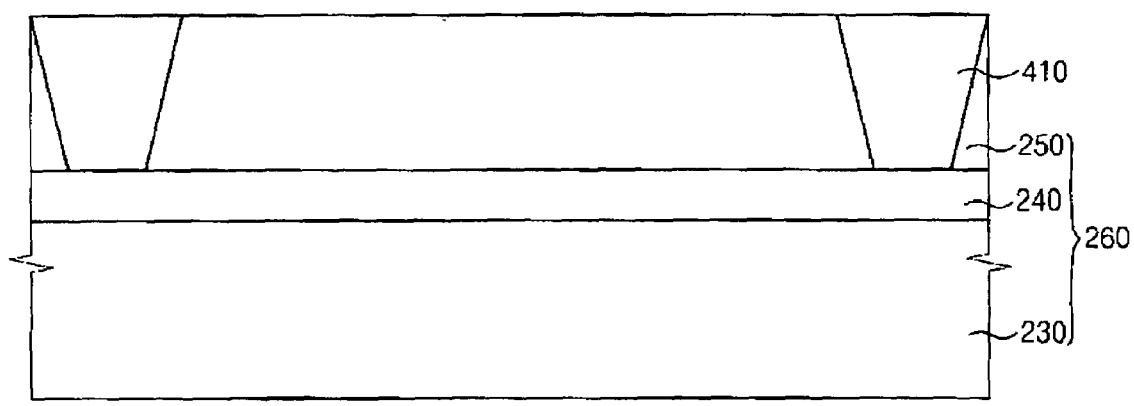
FIGS. 5A and 5B are cross sectional views illustrating a method for manufacturing a semiconductor device in accordance with a fourth embodiment of the present invention.
Figure 5B:
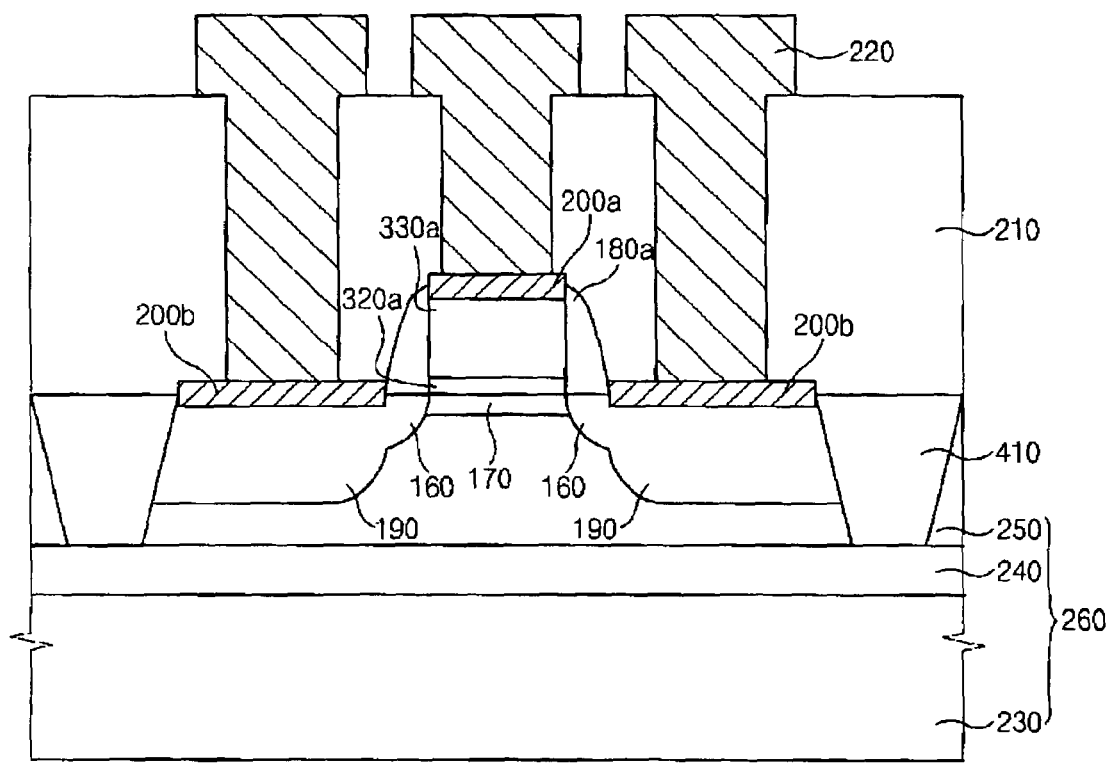

FIGS. 5A and 5B are cross sectional views illustrating a method for manufacturing a semiconductor device in accordance with a fourth embodiment of the present invention.

In the drawings of the present embodiment, same reference numerals refer to substantially the same elements as in the first and third embodiments. Thus, any further illustrations of the same elements are omitted.

Referring to FIG. 5A, an SOI substrate 260 includes sequentially a silicon substrate (not shown), a buried oxide layer (not shown), and a single crystalline silicon layer (not shown). A hard mask layer (not shown) and a pad oxide layer (not shown) are sequentially formed on single crystalline silicon layer 250. The hard mask layer and the pad oxide layer are patterned to form a hard mask layer pattern (not shown). Single crystalline silicon layer 250 is etched using the hard mask layer pattern as an etching mask to form a shallow trench exposing buried oxide layer 240. A silicon oxide layer (not shown) such as an undoped silicate glass layer, a high-density plasma oxide layer, or the like is formed on substrate 260 and in the trench. The silicon oxide layer is removed by a chemical mechanical polishing (CMP) process or an etch-back process until the front face of single crystalline silicon layer 250 is exposed. The hard mask layer pattern is removed by a dry etching process to form an isolation layer 410 defining an active region and a field region in substrate 260.

Referring to FIG. 5B, a gate insulation layer (not shown), a polysilicon layer (not shown), and a buffer oxide layer (not shown) are sequentially formed on single crystalline silicon layer 250. Metal diffusion-prevention layers 350a, 350b of silicon nitride are formed on resultant structure and bottom surface of silicon substrate 230, respectively.

Metal diffusion-prevention layer 350a is removed by a dry etching process. Buffer oxide layer is then removed by a wet etching process.

Polysilicon layer and gate insulation layer are patterned to form a gate electrode 330a having a gate insulation layer pattern 320a on the active region. Low concentration of first impurities are implanted into single crystalline silicon layer 250 using gate electrode 330a as an ion implanting mask to form lightly doped source/drain regions 160 on both sides of gate electrode 330a. As a result, a channel region 170 is formed under gate electrode 330a between lightly doped source/drain regions 160.

A gate spacer layer (not shown) of a second nitride is formed on single crystalline silicon layer 250 and gate electrode 330a. Gate spacer layer is etched-back to form a gate spacer 180a on sidewalls of gate electrode 330a.

High concentration of second impurities are implanted into single crystalline silicon layer 250 to form heavily doped source/drain regions 190 on both sides of gate electrode 330a. Silicide layers 200a, 200b are formed on gate electrode 330a, and highly doped source/drain regions 190, respectively.

An insulating interlayer (not shown) is formed on single crystalline silicon layer 250, silicide layers 200a, 200b, and gate spacer 180a. The insulating interlayer is partially etched to form an insulating interlayer pattern 210 having a plurality of contact holes that expose silicide layers 200a, 200b. A metal layer (not shown) is formed on insulating interlayer 210 and in the plurality of contact holes. The metal layer is patterned to form a metal wiring 220 electrically connected to silicide layers 200a, 200b. Finally, metal diffusion-prevention layer 350b underneath silicon substrate 230 is then removed. The metal layer is preferably copper.

According to the present invention, a metal diffusion-prevention layer is formed prior to the formation of lightly doped source/drain regions to prevent metal atoms, preferably, copper atoms, from diffusing into the substrate. Also, a lateral diffusion of impurities in the lightly doped source/drain regions is lowered, thereby suppressing the short channel effect.

Having described the preferred embodiments of the present invention, it is noted that modifications and variations can be made by persons skilled in the art in light of the above teachings. It is therefore to be understood that changes may be made in the particular embodiment of the present invention disclosed which is within the scope of the invention.

What is claimed is:

1. A method for forming a semiconductor device, comprising:
   forming a metal diffusion-prevention layer on a bottom surface of a substrate at a first temperature;
   forming a gate electrode in an active region defined on a top surface of the substrate after forming the metal diffusion-prevention layer;
   forming impurity regions in the top surface of the substrate after forming the metal diffusion-prevention layer, so that the impurity regions are not subjected to the first temperature used during the formation of the metal diffusion-prevention layer; and
   forming a metal wiring on the impurity regions.

2. The method of claim 1, wherein the metal diffusion-prevention layer comprises a silicon nitride layer.

3. The method of claim 1, wherein the substrate comprises a silicon-on-insulator substrate.

4. The method of claim 1, wherein the metal wiring comprises copper.

5. The method of claim 1, wherein forming the metal diffusion-prevention layer comprises:
   performing a low pressure chemical vapor deposition (LPCVD) process at the first temperature, which is about 700° C. to 750° C.

6. The method of claim 1, further comprising:
   forming a gate spacer layer on the top surface of the substrate at a second temperature, the second temperature being lower than the first temperature; and
   forming a gate spacer on sidewalls of the gate electrode by etching the gate spacer layer.

7. The method of claim 6, wherein forming the gate spacer layer comprises:
   performing a plasma enhanced chemical vapor deposition (PECVD) process at the second temperature, which is less than about 500° C.

8. The method of claim 6, wherein the gate spacer layer comprises a silicon nitride layer.

9. The method of claim 1, further comprising:
   forming a hard mask layer on the top surface of the substrate at the first temperature; and
   forming an isolation layer by patterning and etching the hard mask layer, the isolation layer defining the active region on the top surface of the substrate.

10. A method for forming a semiconductor device, comprising:
    forming a metal diffusion-prevention layer on a bottom surface of a substrate at a first temperature;
    forming a gate electrode in an active region defined on a top surface of the substrate;
    implanting first impurities into the substrate using the gate electrode as a first ion-implanting mask, after forming the metal diffusion-prevention layer, to form lightly doped source/drain regions;
    forming a gate spacer on sidewalls of the gate electrode;
    implanting second impurities into the substrate using the gate electrode and the gate spacer as a second ion-implanting mask, after forming the metal diffusion-prevention layer, to form heavily doped source/drain regions;
    forming a metal wiring on the heavily doped source/drain regions and the gate electrode; and
    electrically connecting the metal wiring to the heavily doped source/drain regions and the gate electrode;
    wherein, by implanting the first and second impurities into the substrate after forming the metal diffusion-prevention layer, the lightly doped source/drain regions and the heavily doped source/drain regions are not subjected to the first temperature during the formation of the metal diffusion-prevention layer.

11. The method of claim 10, further comprising forming a silicide layer on the gate electrode and the heavily doped source/drain regions after implanting the second impurities, wherein the metal wiring is electrically connected to the silicide layer on the gate electrode and the heavily doped source/drain regions.

12. The method of claim 10, further comprising forming an isolation layer prior to forming the metal diffusion-prevention layer.

13. The method of claim 10, wherein the metal wiring comprises copper.

14. The method of claim 10, wherein the metal diffusion-prevention layer comprises a silicon nitride layer.

15. The method of claim 10, wherein forming the gate spacer, comprises:

forming a gate spacer layer on the gate electrode and the substrate at a second temperature, the second temperature being less than the first temperature; and performing an etch-back process on the gate spacer layer to form the gate spacer.

16. The method of claim 15, wherein the gate spacer layer comprises a silicon nitride layer.

17. The method of claim 16, wherein the first temperature is about 700° C. to 750° C. and the second temperature is less than about 500° C.

18. A method for forming a semiconductor device, comprising:

stacking a silicon substrate, a buried oxide layer, and a single silicon crystalline layer;

forming a metal diffusion-prevention layer on a bottom surface of the silicon substrate at a first temperature;

forming a gate electrode in an active region defined on a top surface of the single silicon crystalline layer after forming the metal diffusion-prevention layer;

implanting first impurities into the single silicon crystalline layer using the gate electrode as a first ion-implanting mask to form lightly doped source/drain regions without subjecting the lightly doped source/drain regions to the first temperature;

forming a gate spacer on sidewalls of the gate electrode;

implanting second impurities into the single silicon crystalline layer using the gate electrode and the gate spacer as a second ion-implanting mask to form heavily doped source/drain regions without subjecting the heavily doped source/drain regions to the first temperature;

forming a metal wiring on the heavily doped source/drain regions and the gate electrode; and electrically connecting the metal wiring to the heavily doped source/drain regions and the gate electrode.

19. The method of claim 18, further comprising forming a silicide layer on the gate electrode and the heavily doped source/drain regions after implanting the second impurities, wherein the metal wiring is electrically connected to the silicide layer on the gate electrode and the heavily doped source/drain regions.

20. The method of claim 18, further comprising forming an isolation layer prior to forming the metal diffusion-prevention layer.

21. The method of claim 18, wherein the metal wiring comprises copper.

22. The method of claim 18, wherein the metal diffusion-prevention layer comprises a silicon nitride layer.

23. The method of claim 18, wherein forming the metal diffusion-prevention layer comprises performing a low pressure chemical vapor deposition (LPCVD) process at the first temperature, and wherein forming the gate spacer comprises forming a gate spacer layer on the gate electrode and the substrate by performing a plasma enhanced chemical vapor deposition (PECVD) process at a second temperature, which is less than the first temperature, and performing an etch-back process on the gate spacer layer.

24. The method of claim 23, wherein the gate spacer layer comprises a silicon nitride layer.

* * * * *